(12) United States Patent
Chapman

(10) Patent No.: US 6,703,313 B2
(45) Date of Patent: Mar. 9, 2004

(54) PRINTING PLATES

(75) Inventor: Jeffrey A. Chapman, Burgess Hill (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/056,098

(22) Filed: Jan. 24, 2002

(65) Prior Publication Data
US 2002/0119665 A1 Aug. 29, 2002

(30) Foreign Application Priority Data

Feb. 23, 2001 (GB) .............................................. 0104611

(51) Int. Cl.[7] ........................................... H01L 21/311
(52) U.S. Cl. ...................................................... 438/700
(58) Field of Search ............................ 438/700; 101/118, 101/395, 368, 463.1; 428/411.1

(56) References Cited

U.S. PATENT DOCUMENTS

| | | | | |
|---|---|---|---|---|
| 3,181,461 A | * | 5/1965 | Fromson et al. | 430/275.1 |
| 4,542,089 A | * | 9/1985 | Cadwell et al. | 430/276.1 |
| 4,597,826 A | * | 7/1986 | Majima et al. | 216/46 |
| 4,707,218 A | * | 11/1987 | Giammarco et al. | 438/421 |
| 5,312,643 A | | 5/1994 | Yamamoto et al. | 427/108 |
| 5,426,074 A | | 6/1995 | Brody | 437/228 |
| 5,521,030 A | * | 5/1996 | McGrew | 430/1 |
| 6,136,508 A | * | 10/2000 | DeBoer et al. | 430/302 |

FOREIGN PATENT DOCUMENTS

| | | | | |
|---|---|---|---|---|
| JP | 03106693 | | 5/1991 | B41N/1/12 |
| JP | 04332694 | | 11/1992 | B41N/1/12 |
| JP | 05057867 | | 3/1993 | B41C/1/02 |
| JP | 5-323111 | | 12/1993 | G02B/5/20 |

OTHER PUBLICATIONS

"A New Process Concept for Large–Area Patterning—A Large–Area Transistor Circuit Fabrication without Using Optical Mask Aligner" Yuji Mori et al. SID 91 Digest, pp. 561–562.

"A TFT Fabrication by Gravure Offest Printing without Mask Aligner" Satoshi Okazaki et al., SID 91 Digest, pp. 563–564.

* cited by examiner

*Primary Examiner*—Richard Elms
*Assistant Examiner*—Michael K. Luhrs

(57) ABSTRACT

A printing plate for use in fabricating electronic circuitry on a substrate. It includes a body layer, and a non-metallic pattern definition layer over the body layer having a printing pattern anisotropically etched into its outer surface. The material of the body layer may be selected to have thermal expansion properties which substantially match those of the substrate, whilst the pattern definition layer may be selected for its etching characteristics.

11 Claims, 2 Drawing Sheets

PRINTING PLATES

The present invention relates to printing plates, and more particularly, to such plates for use in the fabrication of electronic circuitry.

In conventional semiconductor device manufacturing processes, sheets of metals, semiconductors, dielectrics and other materials are deposited uniformly across a substrate. Each layer is then patterned using wet or dry etching, typically using photolithographically defined photoresist layers as masks. These processes are complex and have a relatively low throughput.

Printing techniques enable materials to be directly deposited onto the substrate in a desired pattern, affording a much higher throughput of substrates. One such technique employs gravure or intaglio printing plates which have the pattern to be printed sunk into their surface.

Existing intaglios for printing images or text onto paper are normally formed of either a metal block or a polymer plate mounted onto a metal sheet. However, the use of intaglios made from these materials for the manufacture of electronic circuitry may be problematic. A metal plate is relatively resistant to wear during use, but when printing fine features on a scale required for electronic circuitry, for example line widths below 20 $\mu$m, the grain structure of the metal may have a detrimental effect on the printing quality. A polymer plate does not produce these grain structure artefacts, but its wear resistance is poor.

An additional consideration when printing fine features is the relative expansion properties of the printing plate and the substrate. If they are not sufficiently closely matched, temperature fluctuations may cause misalignment between different layers printed on the substrate. For example, it is desirable to be able to print circuits onto a glass substrate to fabricate active matrix liquid crystal displays (AMLCDs). However, the thermal expansion properties of a metal plate would be quite different to those of the glass substrate. A polymer plate would be a better match, but this difference may still have a substantial effect. A printing plate formed of the same glass as the substrate would be an ideal match. However, it is not practicable to define and etch features of sufficiently high resolution as dry etching of such glasses is too slow, and the isotropic nature of wet etching limits the minimum feature size.

The present invention provides a printing plate for use in fabricating electronic circuitry on a substrate, comprising a body layer, and a non-metallic pattern definition layer over the body layer having a printing pattern anisotropically etched into its outer surface. The material forming the body layer and thus the bulk of the plate may therefore be selected to provide a sufficiently accurate match to the thermal expansion properties of the substrate, whilst the material forming the pattern definition layer may be chosen for its etch properties. In this context, a sufficiently accurate match of thermal expansion properties or reference to two materials having substantially the same thermal expansion properties concerns their properties over the temperature range to which the printing plate and substrate may be subjected during the printing process, the match being sufficiently close for any relative expansion to have a negligible effect on the alignment of printed patterns over that temperature range.

The use of an anisotropic etch process enables the formation of a pattern having relatively steep side walls which in turn allows fine features to be printed. Preferably, the angle between a normal to the plate and the upper portion of the side walls of the pattern (referred to as the release surface angle) is approximately 25° or less. An angle of around 10° or less is preferable for particularly fine patterns.

The pattern definition layer may comprise material selected from polyimide, silicon dioxide, silicon nitride, and sol gel materials. The plate may also include a wear resistant layer over the pattern definition layer, which is more resistant to wear than the pattern definition layer.

In a preferred embodiment, the body layer is formed of material selected substantially to match the thermal expansion properties of the substrate. The body layer may comprise glass or quartz.

The present invention further provides a method of forming a printing plate for use in fabricating electronic circuitry on a substrate, comprising providing a body layer, depositing an additional non-metallic layer over the body layer, providing a mask layer over the pattern definition layer, and anisotropically etching a printing pattern into the outer surface of the pattern definition layer.

The step of providing a mask layer preferably comprises the steps of depositing a metal layer over the pattern definition layer, and patterning the metal layer.

The invention additionally provides a method for fabricating electronic circuitry on a substrate using a printing plate of the form described above, wherein the body layer of the plate is formed of material having thermal expansion characteristics substantially the same as those of the substrate. Preferably, the body layer is formed of the same material as the substrate.

An embodiment of the invention will now be described by way of example and with reference to the accompanying schematic drawings, wherein.

Figure 1A:
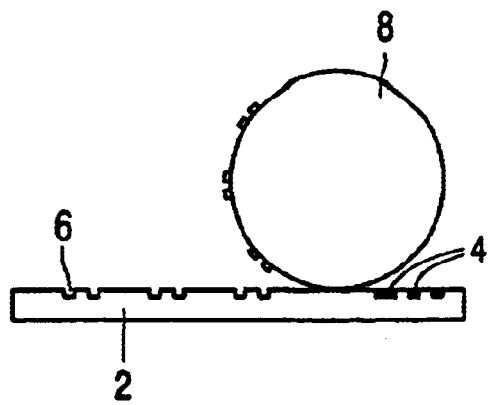
FIGS. 1A and 1B show two stages in a conventional process of offset intaglio printing.

It should be noted that the FIGURES are diagrammatic and not drawn to scale. Relative dimensions and proportions of parts of these FIGURES have been shown exaggerated or reduced in size, for the sake of clarity and convenience in the Drawings.

Figure 1B:
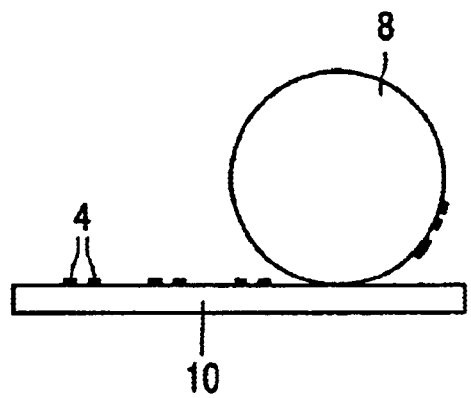

FIGS. 1A and 1B illustrate two stages of a known intaglio offset printing process. The pattern to be printed is etched into the surface of a printing plate 2 as shown in FIG. 1A. Ink 4 is then supplied to the recesses 6 of the pattern. The inked plate is moved relative to a transfer cylinder 8 so that the cylinder rolls over the plate and picks up the pattern of ink. The cylinder is then rolled over a substrate 10 (see FIG. 1B), transferring the pattern thereto. As an alternative to this offset printing process, ink may be transferred from the plate by direct application of the plate to a substrate.

These techniques may be used in the fabrication of electronic circuitry, and particularly, the manufacture of large area electronic devices such as AMLCDs. The materials deposited using printing are typically either resist materials or precursor materials. A pattern of resist may be printed onto blanket-deposited layers to act as a mask during a subsequent etching step. Precursor materials can be converted into electronic materials with the desired properties by further processing. These printing processes can lead to cost reductions in device production by providing higher throughput, reduced capital costs and lower materials costs than conventional processing techniques. However, as noted above, existing intaglio printing plates provide a limited level of resolution and alignment accuracy.

Figure 2:
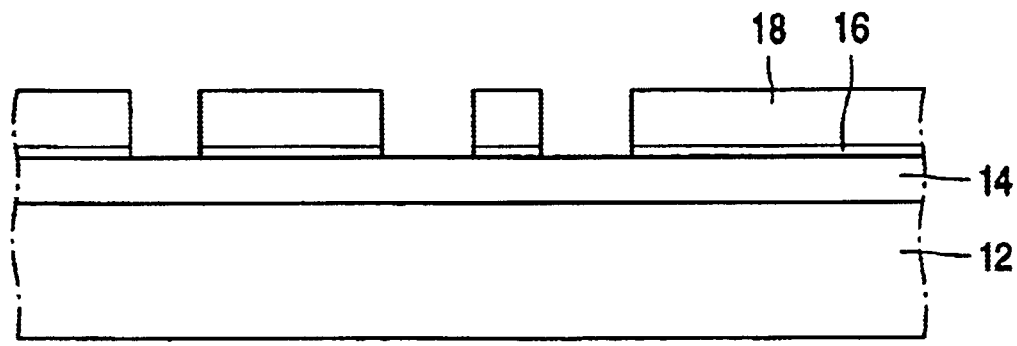
FIG. 2 shows a partial cross-section through a printing plate prior to etching of its surface, an intermediate stage in the fabrication of a plate embodying the present invention.

FIG. 2 shows a printing plate at an intermediate stage in the fabrication of a plate embodying the present invention. It comprises a body layer 12, an additional non-metallic pattern definition layer 14 thereover, a metal layer 16 over the pattern definition layer 14, and a layer of photoresist 18 uppermost. Once these layers have been deposited, the photoresist layer 18 is patterned and then the metal layer 16 is etched to form an in-situ mask for the etching of the pattern definition layer 14, as shown in FIG. 2. It may be advantageous to carry out etching of the metal layer and the pattern definition layer in the same process, thereby avoiding the need to break the vacuum.

As noted above, the material forming the body layer 12 can be selected such that its thermal expansion properties closely match those of the substrate to be printed. In the field of AMLCDs, the substrate may consist of glass or a flexible polymer, for example. The body layer 12 forms the bulk of the printing plate as the pattern definition layer 14 is relatively thin, and so the body layer substantially dictates the plate's thermal expansion properties.

The pattern definition layer 14 is formed of a hard, scratch resistant material which is suitable for etching using anisotropic etching processes. It may comprise material selected from polyimide, silicon dioxide, silicon nitride, and sol gel materials. A layer of silicon dioxide or silicon nitride may be sputtered onto the plate. Polymers may typically be spun on or sheet printed. Examples of suitable sol gel materials are a methyltrimethoxysilane (MeTMS) matrix filled with silicon dioxide particles of around 20 nm diameter and monoaluminophosphate layers filled with titanium dioxide and titanium nitride particles.

Anisotropic etching processes form relatively steep sided features, compared to isotropic techniques, such as conventional wet etching. Accordingly, dry etching processes such as reactive ion etching, sputtering or plasma etching are suitable. For example, oxygen alone, or a mix of oxygen with $CHF_3$ or $CF_4$ or both may be used to reactive ion etch polyimide, silicon dioxide and silicon nitride with sufficiently well defined results. The addition of around 5% of $CHF_3$ or $CF_4$ to oxygen has been found to assist in controlling the wall steepness.

Figure 3:
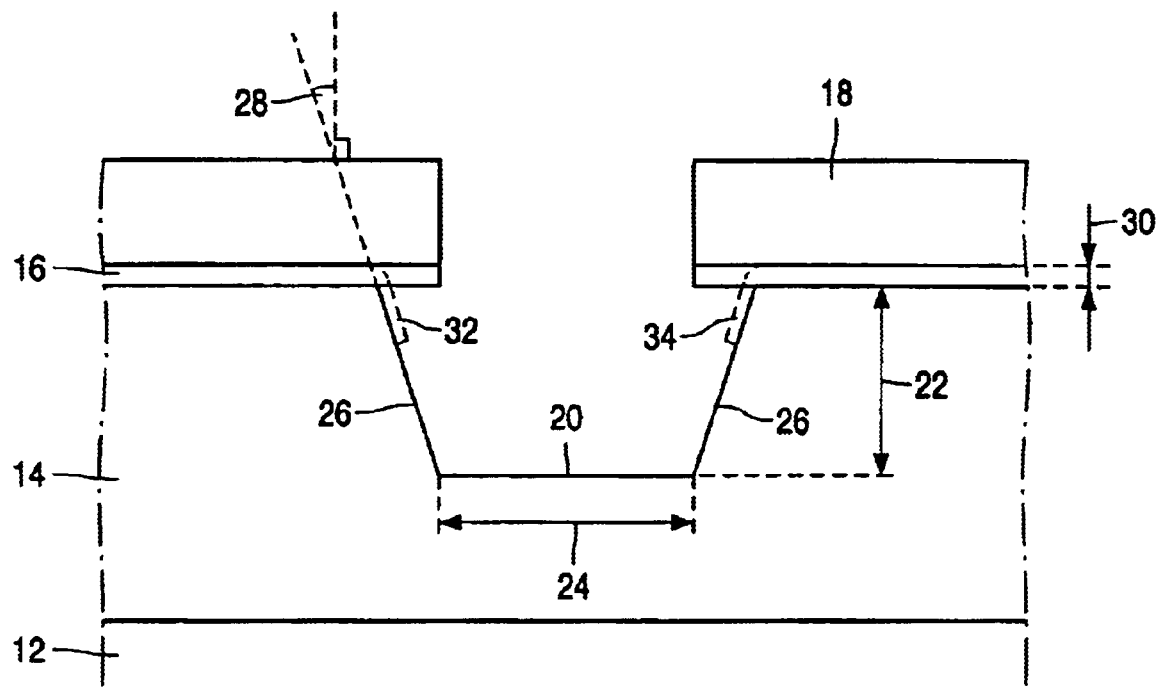
FIG. 3 shows a partial cross-section through the printing plate of FIG. 2 after etching has taken place.

An enlarged, partial cross-section through the printing plate of FIG. 2 after etching has taken place is illustrated in FIG. 3. It shows a groove 20 etched into the outer surface of pattern definition layer 14. For the purposes of printing electronic circuitry, the depth 22 of the groove may typically be around 10 to 30 $\mu$m, whilst the width may be varied over a wide range, from 10 $\mu$m or less, up to 100 $\mu$m or more.

Even with an "anisotropic" etching, the material of layer 14 may be etched back to some extent beneath the metal layer 16. This results in deviation of the side walls 26 from perpendicular relative to the plane of the plate by an angle 28. The ability to form steep sides enables smaller feature sizes to be made. It will be appreciated that the size of the angle 28 depends on the combination of the material chosen to form layer 14 and the etchant gas selected. An angle of 25° or less has been found to give good results.

The metal layer 16 may typically be deposited by sputtering or evaporation. Plating techniques may also be used. It may be formed of aluminium for example and have a thickness 30 of around 250 nm. A metal is selected which does not react significantly with the etchant gases. The thickness of the layer may vary depending on the metal used. It has been realised that the portion of this metal layer which extends beyond the side walls 26 owing to etching back of layer 14 tends to fold down over the side walls during the etching process, as illustrated in FIG. 3 by dotted portions 32 and 34 if it is sufficiently thin. After the etching step has been completed, the remainder of the photoresist 18 and the metal layer 16 are removed. The folding over of the edge portions of the metal layer results in a relatively smooth surface on the side walls adjacent the outer surface of the layer 14 compared to the remainder of the groove surface. This may assist in the clean release of printing material from the groove during a printing process.

Figure 4:
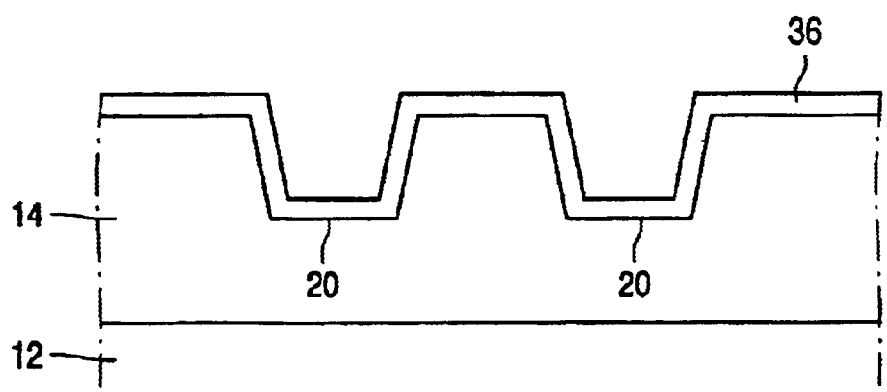
FIG. 4 shows a partial cross-section through a printing plate which includes a wear resistant layer.

The material used to form the pattern definition layer of a plate, whilst having desirable etch properties, may not be sufficiently scratch and/or wear resistant for a particular application or high volume production. In that case, as illustrated in FIG. 4, it may be coated with a conformal layer 36 of more scratch and/or wear resistant material after the printing pattern has been etched into its surface. Where the pattern definition layer 14 is formed of a polymer, for example, a suitable material for the wear resistant layer 36 may be silicon nitride or silicon dioxide. These materials may be deposited by PECVD or sputtering for example. A wear resistant layer thickness of around 0.25 $\mu$m may typically be suitable.

From reading the present disclosure, other variations and modifications will be apparent to persons skilled in the art. Such variations and modifications may involve equivalent and other features which are already known in the design, manufacture and use of printing plates, and electronic circuitry formed using such plates, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention. Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

I claim:

1. A printing plate for use in fabricating electronic circuitry on a substrate comprising a body layer and a non-metallic pattern definition layer over the body layer having a printing pattern anisotropically etched into its outer surface.

2. A plate of claim 1 wherein the acute angle between a normal to the plate and the upper portion of the side walls of the pattern is approximately 25° or less.

3. A plate of claim 1 wherein the pattern definition layer comprises material selected from polyimide, silicon dioxide, silicon nitride, and sol gel materials.

4. A plate of claim 1 including a wear resistant layer over the pattern definition layer which is more resistant to wear than the pattern definition layer.

5. A plate of claim 1 wherein the body layer is formed of material selected substantially to match the thermal expansion properties of the substrate.

6. A method of forming a printing plate for use in fabricating electronic circuitry on a substrate comprising:

providing a body layer, depositing a non-metallic pattern definition layer over the body layer, providing a mask layer over the pattern definition layer, and anisotropically etching a printing pattern into an outer surface of the pattern definition layer.

7. A method of claim 6 wherein the step of providing a mask layer comprises the steps of depositing a metal layer over the pattern definition layer and patterning the metal layer.

8. A method of claim 6 including the step of depositing a wear resistant layer over the pattern definition layer after the etching step.

9. A method for fabricating electronic circuitry on a substrate, comprising:

providing a printing plate that includes a body layer and a non-metallic pattern definition layer over the body layer, the pattern definition layer having a printing pattern anisotropically etched into its outer surface, filling the pattern definition layer with ink, and transferring the ink to the substrate, wherein the body layer of the plate is formed of material having thermal expansion characteristics substantially the same as those of the substrate.

10. A method of claim 9 wherein the body layer is formed of the same material as the substrate.

11. An electronic device comprising electronic circuitry fabricated using a printing plate formed by the method of claim 6.

* * * * *